United States Patent [19]
Park

[11] Patent Number: 5,978,068
[45] Date of Patent: Nov. 2, 1999

[54] APPARATUS FOR PROTECTING A REFERENCE MARK USED IN EXPOSURE EQUIPMENT

[75] Inventor: Soon-Jong Park, Yongin, Rep. of Korea

[73] Assignee: Samsung Electrics Co., Inc., Suwon, Japan

[21] Appl. No.: 08/991,245

[22] Filed: Dec. 16, 1997

[30] Foreign Application Priority Data

Dec. 23, 1996 [KR] Rep. of Korea .................... 96-70675

[51] Int. Cl.$^6$ ............... G03B 27/42; G03B 27/54
[52] U.S. Cl. ......................... 355/53; 355/67
[58] Field of Search ................. 355/43, 30, 53, 355/71, 67, 75, 70, 72; 356/400, 401, 399; 250/548; 430/22

[56] References Cited

U.S. PATENT DOCUMENTS

| | | | |
|---|---|---|---|
| 3,245,794 | 4/1966 | Conley | 430/22 |
| 3,844,655 | 10/1974 | Johannsmeier | 355/43 |
| 5,521,036 | 5/1996 | Iwamoto et al. | 430/22 |
| 5,675,402 | 10/1997 | Cho | 355/71 |
| 5,760,881 | 6/1998 | Miyazaki | 355/71 |

FOREIGN PATENT DOCUMENTS

| | | | |
|---|---|---|---|
| 0358521 | 3/1990 | European Pat. Off. | 430/22 |
| 404240853 | 8/1992 | Japan | 430/22 |
| 406275491 | 9/1994 | Japan | 430/22 |

*Primary Examiner*—Safet Metjahic
*Assistant Examiner*—Hung Henry Nguyen
*Attorney, Agent, or Firm*—Jones Volentine, L.L.P.

[57] ABSTRACT

A reference mark member used in exposure equipment is protected from being contaminated. A cover assembly, which includes a shutter-like cover, can be selectively opened and closed over the reference mark member to protect the same. A driving system drives the cover between its open and closed positions. An electronic controller controls the operation of the driving system based on the operating state of the equipment. The cover assembly may also include an annular support for the cover which extends around the reference mark member to offer further protection for the same. Protecting the reference mark member prevents the contamination of the reference mark which could lead to an error in an alignment task for which the reference mark is used.

18 Claims, 4 Drawing Sheets mark site mark site
contaminant site

APPARATUS FOR PROTECTING A REFERENCE MARK USED IN EXPOSURE EQUIPMENT

BACKGROUND OF THE INVENTION

1. Field of the Invention

The present invention relates to exposure equipment for use in manufacturing semiconductor devices, and more particularly, to an apparatus for protecting reference marks used in the exposure equipment.

2. Description of the Related Art

Generally, the process of manufacturing semiconductor devices involves a wide variety of steps including cleaning, diffusion, photolithography, etching, ion implantation, and the like. These steps are repeatedly performed on a semiconductor wafer in the mass-production of well-known commercial semiconductor devices.

Of the above-stated steps, photolithography is used for forming patterns on a semiconductor wafer. In this process, the image of the pattern of a reticle is projected on the wafer surface using a photoresist. The photolithography process generally involves several steps, that is, photoresist coating, alignment, exposure, development, and inspection. The photoresist is applied by a spin coater, a stepper is used for the alignment and exposure steps, and the inspection step is conducted using inspection equipment.

Successful completion of the alignment/exposure steps using the stepper depends significantly on the alignment of a reticle and a wafer. To effect a correct alignment, a key pattern is formed on the surfaces of the reticle and wafer. For example, the key pattern on the reticle is aligned with a fiducial or fixed reference mark that is formed on a member mounted on a stage of the stepper.

FIG. 1 shows one part of a conventional stepper for driving a stage 10 on which wafers are placed. The stepper comprises an X-motor 12 and a Y-motor 16 which are oriented along an X-axis and a Y-axis, respectively. These motors 12,16 drive the stage 10 through screws 14 and 18, respectively. The location and alignment of the stage 10 is controlled by the screws 14 and 18.

A lamp check sensor 20, a light intensity sensor 22, and a reference mark assembly 24 are located on respective corners of the stage 10. The lamp check sensor 20 senses (monitors) the state of the light radiated onto the stage 10 and the uniformity of its intensity to thereby check the efficiency of a lamp or light source. The light intensity sensor 22 detects the intensity of light transmitted through a projection reduction lens (not shown) having a reticle (also not shown) mounted thereon. The reference mark assembly 24 is used for reticle alignment, and as shown in FIG. 2, a reference mark member 26 is mounted on the top surface of a base 28. The base 28 is fixed to the stage 10 by bolts 30.

The conventional reference mark member 26 is exposed at the top surface of the base 28, and can be contaminated by particles or impurities while the wafer stage is being checked or cleaned, and the stepper is operating.

As shown in FIG. 3, the reference mark member 26 has a pattern comprising a plurality of reference mark sites 32 which are used for the alignment of the reticle. The mark sites 32 are on the order of a micrometer. FIG. 4A is a representation of signals optically detected from a mark site 32, and the signal from such a mark site 32 is clearly distinguished from those from other regions.

Again, referring to FIG. 3, the reference mark member 26 can be contaminated by a contaminant 34, such as a particle or an impurity. Therefore, when the alignment task is conducted, optically-detected signals from the contaminant 34 are produced along with those from the mark sites 32 as illustrated in FIG. 4B. In a seriously contaminated reference mark member 26 it is difficult to distinguish the mark sites 32 from the contaminated areas 34. Accordingly, a reticle alignment error often occurs in the stepper.

In fact, the conventional reference mark member is so easily contaminated that problems such as reticle alignment error, stepper mis-operation, and exposure defects occur, thus creating problems adversely affecting the reliability of the stepper.

SUMMARY OF THE INVENTION

The present invention is directed to an apparatus for protecting a reference mark that substantially overcomes one or more of the limitations and disadvantages of the related art.

One object of the present invention is to provide an apparatus in the exposure equipment which prevents the reference mark from being contaminated, to thereby in turn prevent a reticle alignment error from occurring.

To achieve these and other objects, the present invention provides an apparatus for protecting a reference mark which is located on a stepper of exposure equipment, and comprises a cover assembly including a cover which is opened and closed for exposing and covering the reference mark; driving force supply means for applying a driving force to the cover assembly; driving means for controlling the driving force supply means; an electronic controller for generating a control signal that controls the driving means, and generating an error signal indicative of an abnormal operation of the cover assembly; sensing means for sensing the position of the cover and issuing a sensing signal indicative of the sensed position; and checking means for issuing a check signal to the controller based on the sensing signal and the control signal produced by the controller.

The driving force supply means comprises a first and a second passage through which hydraulic fluid passes to the cover assembly, and a first and a second solenoid valve which are installed in the first and the second passages, respectively.

The driving means comprises a first and a second switch for outputting first and second switching signals based on the signal from the controller. The driving means is configured so that the cover will be opened by the first switching signal and closed by the second switching signal. Preferably, the sensing means consists of a magnetic sensor.

The checking means consists of an Exclusive OR gate for logical-summing of the sensing signal and the control signal, and a NOT gate (inverter) for reversing the output of the Exclusive OR gate to output a checking signal.

The apparatus of the present invention is positioned on a stage of the exposure equipment, wherein the cover is installed on the stage and is opened and closed for selectively exposing and covering the reference mark.

Preferably, the apparatus is used in connection with reticle alignment or checking the equipment. The cover preferably comprises an electronically-driven shutter which is selectively opened and closed over the reference mark. Specifically, the cover of the cover assembly is driven by hydraulic pressure applied to a rod which is connected therewith and fixed on a body of the stage.

The apparatus further comprises a support which is spaced apart from and extends above the member on which the reference mark is formed so as to protect the reference mark from other parts of the apparatus. This support is fixed on the cover assembly. Preferably, the support is annular and is fixed on a base on which the reference mark member is mounted.

BRIEF DESCRIPTION OF THE DRAWINGS

The present invention will be described below with reference to the accompanying drawings, wherein.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
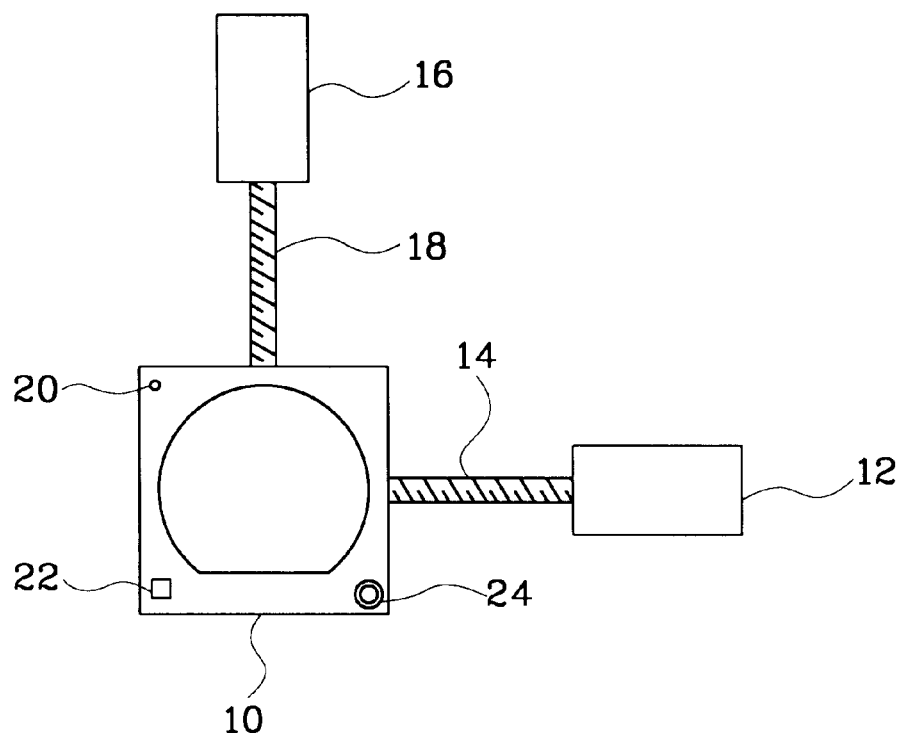
FIG. 1 is a plan view of a driver of a stage of conventional exposure equipment.
Figure 2:
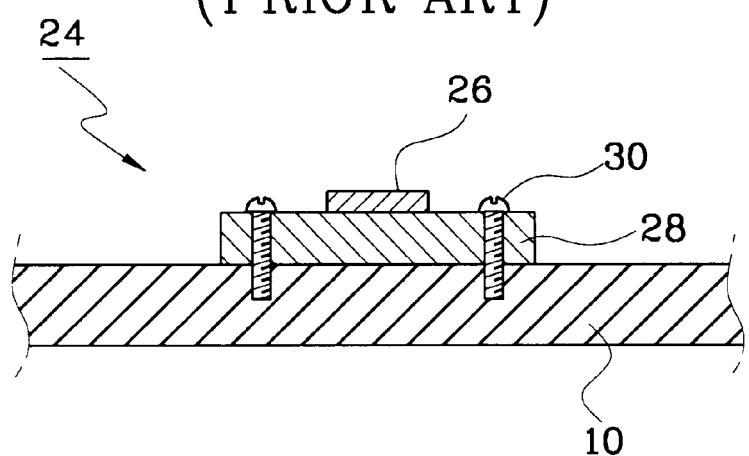
FIG. 2 is a sectional view of a reference mark member installed on the stage of the conventional exposure equipment.
Figure 3:
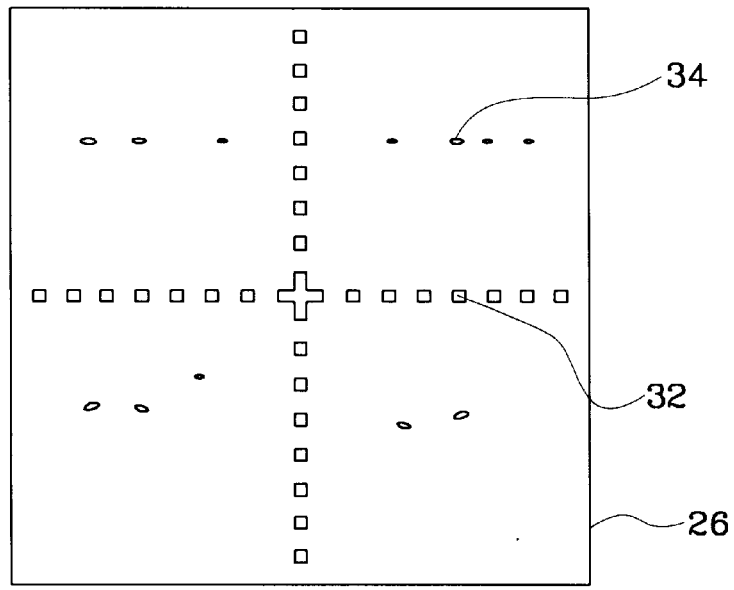
FIG. 3 is a plan view of a reference mark member of the conventional exposure equipment.
Figure 4A:
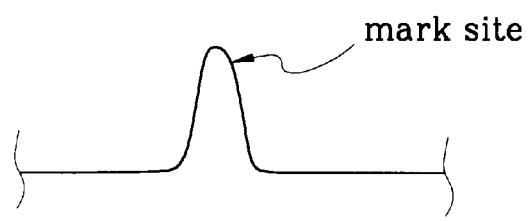
FIG. 4A is a representation showing waveforms of signals detected from a reference mark site during a normal state of operation.
Figure 4B:
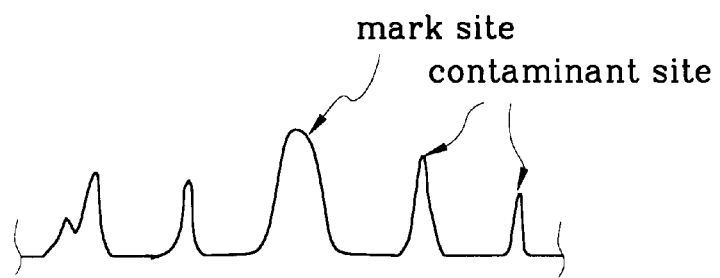
FIG. 4B is a representation showing waveforms of signals detected from a reference mark site on a contaminated reference mark member.
Figure 5:
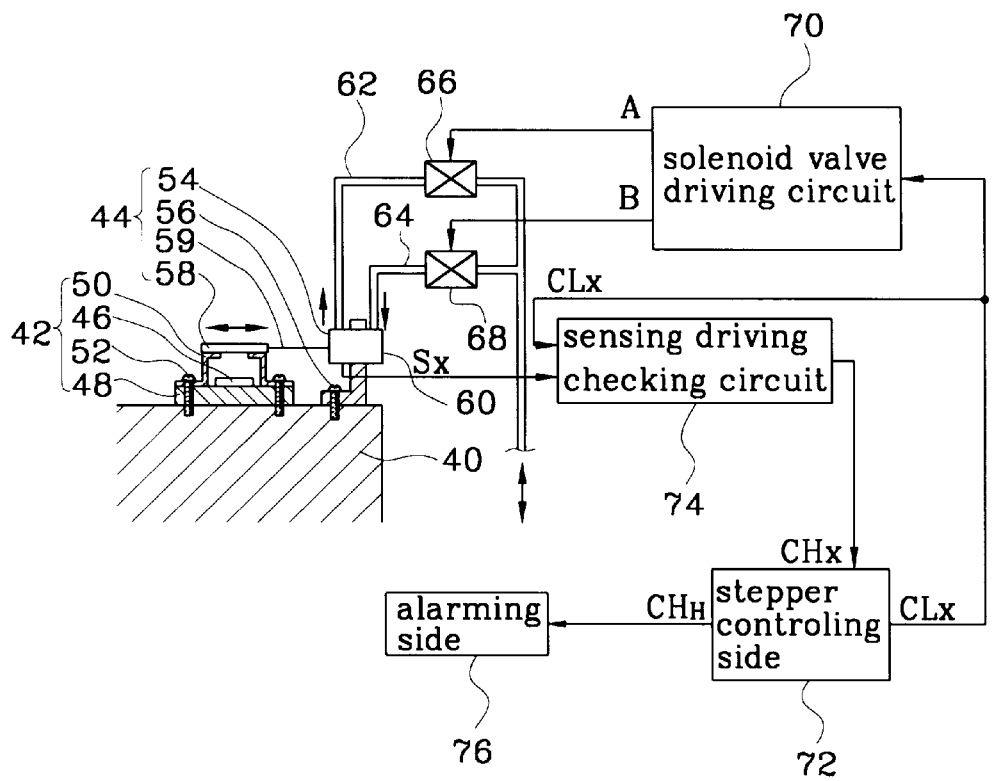
FIG. 5 is a of a schematic diagram of one embodiment of an apparatus for protecting a standard reference mark according to the present invention.

FIG. 5 illustrates an embodiment of the present invention where a reference mark assembly 42 and a cover assembly 44 are installed on a stage 40 of a stepper of exposure equipment. In the reference mark assembly 42, a base 48 and a support 50 are fixed to the stage 40 by bolts 52. A reference mark member 46, having a pattern comprising at least one mark site 32 (FIG. 3), is in turn mounted on the base 48. The support 50 is spaced apart from and extends over the reference mark member 46.

The cover assembly 44 has a body 54 fixed on the stage 40 by a bolt 56, a rod 59 which is moved back and forth by hydraulic pressure, and a cover 58 connected to one end of rod 59. The cover 58 may comprise an electrically driven electronic-shutter. In addition, a magnetic sensor 60 for sensing the position of the rod 59 is installed on one side of the body 54.

Figure 6:
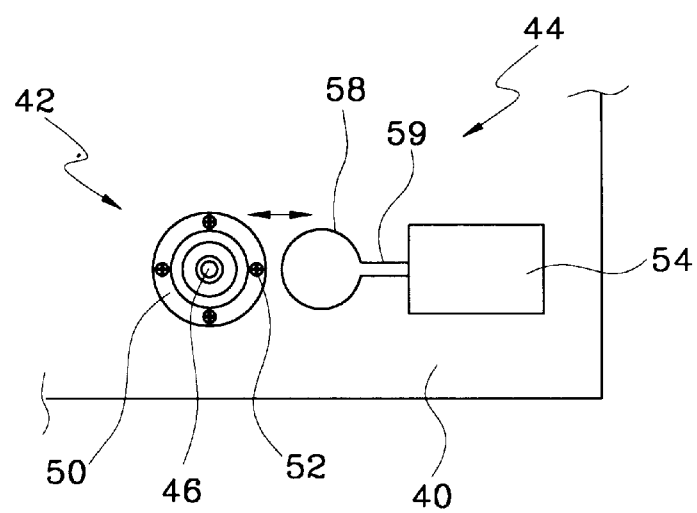
FIG. 6 is a plan view of a cover assembly according to the present invention.

FIG. 6 is a plan view of the cover assembly 44 and the reference mark assembly 42. Referring now to FIG. 5 and FIG. 6, the rod 59 fixed to the body 54 of the cover assembly 44 is moved back and forth by fluid, such as air, supplied through passages 62 and 64 so that the cover 58 is driven responsive thereto. The body 54 and rod 59 may be in the form of a cylinder (hydraulic or pneumatic) or may be replaced with other well-known opening/closing mechanisms.

Solenoid valves 66 and 68 for controlling the charging and discharging of air are installed in passages 62 and 64, and are operated in compliance with switching signals A and B, respectively, generated by a solenoid valve driving circuit 70.

The solenoid driving circuit 70 produces the switching signals A and B based on a control signal $CL_X$ issued from a stepper controller 72. A circuit diagram of the solenoid value driving circuit 70 is shown in FIG. 7.

Figure 7:
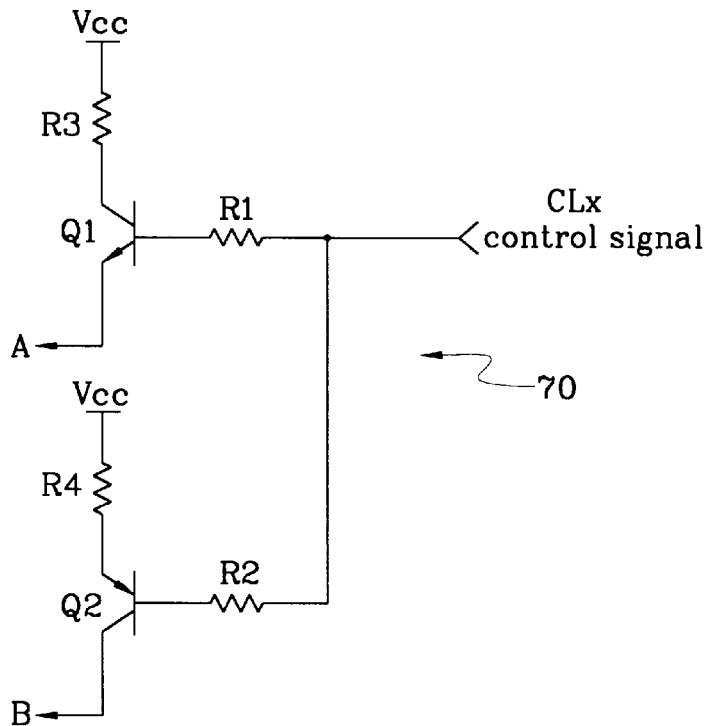
FIG. 7 is a circuit diagram of the solenoid driver circuit according to the present invention.

Referring to FIG. 7, the control signal $CL_X$ input to the solenoid driving circuit 70 is applied to bases of transistors (Q1,Q2) through resistors R1 and R2. The transistors (Q1, Q2) are NPN and PNP types of transistors, respectively, in which their state reverses according to different levels of applied voltage signals. Switching signals A and B, having different voltage levels, are outputted based on a constant voltage $V_{cc}$ applied across the resistors R3, R4 and on the switching state of the transistors (Q1, Q2).

In the following discussion, a high level signal is denoted by the subscript 'H', and a low level signal is denoted by the subscript 'L', appearing after the signal designation. The subscript 'x' appearing after a signal designation denotes a signal that may have either a high level (subscript 'H') or low level (subscript 'L').

Figure 8:
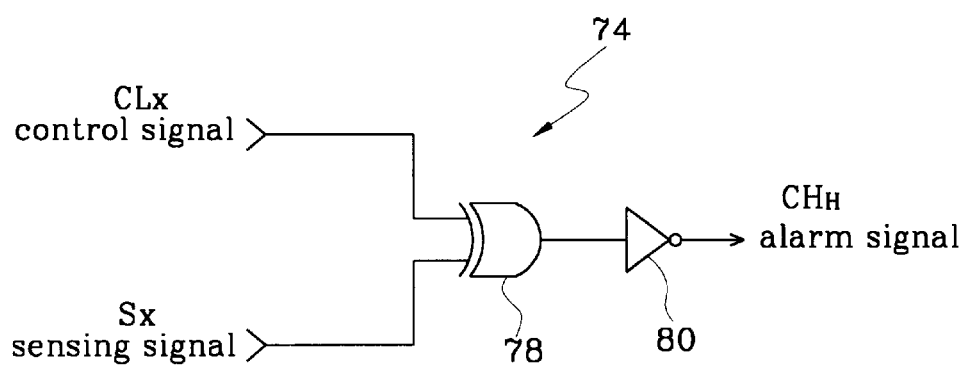
FIG. 8 is a circuit diagram of a sensing driving checking circuit according to the present invention.

The stepper controller 72 controls the alarm 76 in compliance with a checking signal $CH_H$ generated by a sensing driving checking circuit 74. The sensing driving checking circuit 74 outputs its checking $CH_X$ signal in compliance with the output control signal $CL_X$ of the stepper controller 72 and a sensing signal $S_X$ issued by the magnetic sensor 60. To accomplish this, as illustrated in FIG. 8, the sensing driving checking circuit 74 outputs an alarm signal $CH_H$ through a NOT gate (inverter) 80 when the control signal $CL_X$ and sensing signal $S_X$ are issued to an Exclusive OR gate 78 at the same voltage level. This operation will be described in greater detail later.

In general, the marking on the reference mark member 46 is exposed when an alignment task is carried out, and is covered during exposure processing and equipment cleaning/checking so as to be protected from becoming contaminated. To this end, the stepper controller 72 issues a control signal $CL_H$ at a high level to both the solenoid valve driving circuit 70 and sensing driving checking circuit 74 when reticle alignment is carried out and otherwise issues a low level control signal $CL_L$.

The driving of the cover assembly 44 according to the control signal $CL_X$ of the stepper controller 72 will now be explained. When a high level control signal $CL_H$ is outputted from the stepper controller 72 to the solenoid valve driving circuit 70, a high level voltage is applied to the bases of the transistors (Q1,Q2) inside the solenoid valve driving circuit 70 so that transistor Q1 turns on and transistor Q2 turns off.

With transistor Q1 on, the solenoid valve driving circuit 70 issues a high level switching signal A to the solenoid valve 66, and a low level switching signal B to the solenoid valve 68. Therefore, after the solenoid valve 66 is opened and the solenoid valve 68 is closed, air is discharged from the body 54 of the cover assembly 44 through the passage 62, and the cover 58 is moved back toward the body 54. Therefore, the reference mark member 46 is exposed.

On the other hand, when a low level control signal $CL_L$ is issued from the stepper controller 72 to the solenoid valve driving circuit 70, a low level voltage is applied to the bases of transistors (Q1,Q2) of the solenoid valve driving circuit 70, whereby transistor Q2 turns on, and transistor Q1 turns off.

Because transistor Q2 turns on, the solenoid valve driving circuit 70 outputs a high level switching signal B to the solenoid valve 68, and a low level switching signal A to the solenoid valve 66. Therefore, the solenoid valve 68 is opened, the solenoid valve 66 is closed, and air is supplied into the body 54 of the cover assembly 44 through the passage 64. Therefore, the cover 58 is moved back over the top of the reference mark assembly 42, whereby the reference mark 46 is covered.

The stepper controller 72 sets the output level of the control signal $CL_X$ according to the reticle movement and state of reticle alignment to drive the cover assembly 44 appropriately. In particular, when the exposure step is carried out or the equipment is cleaned, the reference mark member 46 is covered by the cover 58 so as to be protected from contaminants.

The magnetic sensor 60 is used for checking the state of operation of the cover assembly 44. Specifically, the magnetic sensor 60 senses the location of the rod 59 while the cover 58 is being driven and accordingly outputs a sensing signal $S_X$. A low level sensing signal $S_L$ is issued to the sensing driving checking circuit 74 when the cover is retracted, thereby allowing the reference mark member 46 to be exposed, and a high level sensing signal $S_H$ is issued to the sensing driving checking circuit 74 when the cover 58 is covering the reference mark member 46.

It can thus be seen that during normal operation of the cover assembly 44, the magnetic sensor 60 outputs a low level sensing signal $S_L$ for opening the cover 58, and outputs a high level sensing signal $S_H$ for closing the cover 58. That is, a low level sensing signal $S_L$ from magnetic sensor 60 is issued in response to a high level control signal $CL_H$ from the stepper controller 72, and a high level sensing signal $S_H$ from the magnetic sensor 60 is issued in response to a low level control signal $CL_L$ from the stepper controller 72.

As can be discerned from above, during a normal state of the apparatus, a control signal $CL_X$ and a sensing signal $S_X$ having different voltage levels are issued to the Exclusive OR gate 78 in the sensing driving checking circuit 74 (FIG. 8). The output of the Exclusive OR gate 78 is thus at a high level, and the NOT gate 80 reverses this high level output signal so as to apply a low level output signal to the stepper controller 72 as a check signal $CH_L$.

However, when the cover assembly 44 is operating abnormally, that is, it is not normally opened even while a high level control signal $CL_H$ is being output from the stepper controller 72, the magnetic sensor 60 mistakenly senses that the cover is closed, thereby outputting a high level sensing signal $S_H$. Accordingly, a control signal $CL_H$ and a sensing signal $S_H$ with identical voltage levels will be applied to the input terminal of the Exclusive OR gate 78. Therefore, the output of the Exclusive OR gate 78 will be at a low level, and this low level output signal is reversed by the NOT gate 80 so that a high level output signal is issued to the stepper controller 72 as a check signal $CH_H$.

When the stepper controller 72 receives a high level check signal $CH_H$ from the sensing driving checking circuit 74, it issues a signal to the alarm 76. This indicates that the cover assembly 44 is operating in error and activates the alarm 76. Consequently, the cover assembly 44 is monitored to determine whether it is operating properly with regard to the reference mark member 46.

In addition, the support 50 prevents the cover 58 from falling, under applied pressure, onto the reference mark member 46. Such action could damage and contaminate the member 46. Preferably, support 50 has an annular or ring-like configuration.

With the present invention, the misalignment of the reticle due to contamination of the reference mark is prevented, and the state of the cover over the reference mark is monitored at all times so that any abnormal driving state thereof will be detected right away and indicated by the alarm 76. Therefore, equipment making use of the present invention is highly reliable, and it is not necessary to check the equipment as often, whereby the equipment provides a high level of efficiency.

It will be apparent to those skilled in the art that various modifications and variations can be made in the present invention without departing from the spirit or scope of the invention. Thus, all such modifications and variations within the scope of the appended claims are seen to be within the true spirit and scope of the present invention.

What is claimed is:

1. An apparatus for use with a reference mark located on a stage of exposure equipment, said apparatus comprising:
   a cover assembly including a cover for covering a reference mark;
   a driving force supplier which applies a driving force to said cover assembly which moves said cover between an open position and a closed position;
   a driver which controls said driving force supplier;
   a controller operatively connected to said driver which generates a control signal that controls said driver;
   a sensor which senses the position of the cover of said cover assembly and generates a sensing signal indicative thereof; and
   a checker, operatively connected to said sensor and to said controller, which receives the sensing signal and the control signal, and based thereon, generates a state signal indicative of an operating state of said cover assembly, wherein said controller generates an error signal when the state signal from the checker indicates the operating state is abnormal.

2. The apparatus as claimed in claim 1, wherein said driving force supplier comprises a first passage and a second passage connected to said cover assembly, and a first and a second solenoid valve which are operatively connected in said first solenoid valve and said second passages, respectively.

3. The apparatus as claimed in claim 1, wherein said driver comprises a first switch and a second switch operative to output, based on said control signal, first and second switching signals to said driving force supply supplier, the cover of said cover assembly being moved to the open position when said first switching signals are output and to the closed position when said second switching signals are output.

4. The apparatus as claimed in claim 1, wherein said sensor is a magnetic sensor.

5. The apparatus as claimed in claim 1, wherein said checker comprises an Exclusive OR gate for executing a logical-summing of said sensing signal and said control signal, and a NOT gate for reversing the output of the Exclusive OR gate to output the state signal.

6. The apparatus as claimed in claim 5, wherein said controller outputs an alarm signal to activate an alarm in accordance with a value of said state signal.

7. An apparatus for protecting a reference mark, said apparatus comprising:

an exposure apparatus including a stage;

a reference mark assembly including a base on which a reference mark is to be mounted on the stage;

a cover installed on the stage, said cover for covering the reference mark, wherein, when said cover is in a closed position, said cover and said reference mark assembly surround a reference mark on said reference mark assembly on all sides;

a selective activator operatively connected to said cover for selectively positioning said cover in the closed position and an open position to respectively cover and expose the reference mark;

a driving force supplier which applies a driving force used to move said cover; and a controller which controls said driving force supplier according to an operational state of said cover.

8. The apparatus as claimed in claim 7, further comprising an annular support mounted on the stage which supports said cover when said cover is in the closed position.

9. The apparatus as claimed in claim 7, wherein said cover comprises an electrically drive electronic-shutter.

10. The apparatus as claimed in claim 7, wherein said opening/closing means comprises a fluid cylinder fixed on the stage, said fluid cylinder including a rod connected to said cover to thereby drive it under applied fluid pressure.

11. The apparatus as claimed in claim 7, wherein said selective activator reciprocates said cover back and forth.

12. The apparatus as claimed in claim 7, wherein said selective activator comprises a first switch and a second switch operative to output, based on an output of said controller, first and second switching signals to said driving force supply supplier, the cover being moved to the open position when said first switching signals are output and to the closed position when said second switching signals are output.

13. An apparatus for protecting a reference mark, said apparatus comprising:

an exposure apparatus including a stage;

a reference mark assembly including a base on which a reference mark is to be mounted on the stage;

a cover installed on the stage, said cover for covering the reference mark, wherein, when said cover is in a closed position, said cover and said reference mark assembly surround a reference mark on said reference mark assembly on all sides;

a selective activator operatively connected to said cover for selectively positioning said cover in the closed position and an open position to respectively cover and expose the reference mark;

a sensor which sense the position of the cover and which generates a sensing signal indicative thereof.

14. The apparatus of claim 13, further comprising:

a controller, operatively connected to said selective activator, which generates a control signal that controls said selective activator;

a checker, operatively connected to said sensor and to said controller, which receives the sensing signal and the control signal and, based thereon, generates a state signal indicative of the operating state of the cover, wherein said controller generates an error signal when the state signal from the checker indicates the operating state is abnormal.

15. The apparatus as claimed in claim 14, wherein said checker comprises an Exclusive OR gate for executing a logical-summing of said sensing signal and said control signal, and a NOT gate for reversing the output of the Exclusive OR gate to output a state signal.

16. An apparatus for use in protecting a reference mark located on a stage of exposure equipment, said apparatus comprising:

a reference mark assembly including a base on which a reference mark is to be mounted;

a cover assembly including a cover for covering a reference mark mounted in said reference mark assembly, wherein when said cover is in a closed position, said cover assembly and said reference mark assembly surround the reference mark on all sides; and a selective activator for selectively positioning said cover in the closed position and in an open position to respectively cover and expose a reference mark;

a controller operatively connected to said selective activator which generates a control signal that controls said selective activator;

a sensor which senses the position of the cover of said cover assembly and generates a sensing signal indicative thereof; and a checker, operatively connected to said sensor and to said controller, which receives the sensing signal and the control signal, and based thereon, generates a state signal indicative of an operating state of said cover assembly.

17. The apparatus as claimed in claim 16, wherein said selective activator is controlled in accordance with state signal.

18. The apparatus as claimed in claim 16, wherein, when the state signal indicates the cover assembly is operating in an abnormal state, said controller outputs an error signal.

* * * * *